United States Patent
Furudate et al.

(10) Patent No.: US 6,567,441 B2
(45) Date of Patent: May 20, 2003

(54) SOURCE FOLLOWER CIRCUIT, LASER DRIVING APPARATUS, SEMICONDUCTOR LASER APPARATUS, CURRENT-VOLTAGE CONVERTION CIRCUIT, AND LIGHT RECEIVING CIRCUIT

(75) Inventors: Seigo Furudate, Yokohama (JP); Eiji Tsumura, Yokohama (JP); Sosaku Sawada, Yokohama (JP); Hiroshi Hara, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/841,694

(22) Filed: Mar. 29, 2001

(65) Prior Publication Data

US 2002/0118716 A1 Aug. 29, 2002

(30) Foreign Application Priority Data

Mar. 31, 2000 (JP) ........................................ 2000-098938

(51) Int. Cl.[7] ................................................ H01S 3/00
(52) U.S. Cl. ......................... 372/38.02; 372/29; 372/8; 327/112; 327/108; 327/111
(58) Field of Search .......................... 372/38.02, 38.07, 372/29.015, 38.1–38.09, 29.01–29.023

(56) References Cited

U.S. PATENT DOCUMENTS

| | | | |
|---|---|---|---|
| 5,349,595 A | * 9/1994 | Ogawa et al. ................. 372/25 |
| 5,399,989 A | 3/1995 | Chern ........................... 330/254 |
| 5,438,582 A | * 8/1995 | Hoshino et al. ........ 372/29.014 |
| 5,532,636 A | * 7/1996 | Mar et al. ..................... 327/157 |
| 5,589,847 A | * 12/1996 | Lewis ............................ 345/87 |
| 5,734,279 A | * 3/1998 | Bereza .......................... 327/108 |
| 5,838,189 A | * 11/1998 | Jeon ............................. 327/525 |
| 5,991,320 A | * 11/1999 | Nakayama ............... 372/38.02 |
| 6,111,901 A | * 8/2000 | Taguchi et al. ................ 372/31 |
| 6,124,741 A | * 9/2000 | Arcus ........................... 326/83 |

* cited by examiner

Primary Examiner—Paul Ip
Assistant Examiner—Tuan Nguyen
(74) Attorney, Agent, or Firm—Smith, Gambrell & Russell, LLP

(57) ABSTRACT

Provided are a source follower circuit having a current source having its improved current characteristics, laser driving apparatus, semiconductor laser apparatus, current-voltage conversion circuit, and light receiving circuit. Each of the laser driving apparatus, semiconductor laser apparatus, current-voltage conversion circuit, and light receiving circuit comprises the source follower circuit. The source follower circuit 10 comprises a source follower stage 12 and a bias stage 14. The source follower stage has III–V compound semiconductor transistors 16, 18 and 20. The bias stage 14 has a first node 22 for providing a first bias voltage and a second node 24 for providing a second biasing voltage different from the first biasing voltage. The gate of transistor 16 is coupled to input 26 and a source thereof is coupled to output 28. The gate of transistor 18 is connected to the second node 24. The gate of transistor 20 is connected to the first node 24. The transistor 20 is arranged between the source of the transistor 16 and the drain of the transistor 18.

18 Claims, 13 Drawing Sheets

SOURCE FOLLOWER CIRCUIT, LASER DRIVING APPARATUS, SEMICONDUCTOR LASER APPARATUS, CURRENT-VOLTAGE CONVERTION CIRCUIT, AND LIGHT RECEIVING CIRCUIT

BACKGROUND OF THE INVENTION

1. Field of the Invention

The present invention relates to a source follower circuit, a laser driving apparatus, semiconductor laser apparatus, a current-voltage conversion circuit, and a light receiving circuit.

2. Related Background Art

A conventional source follower circuit comprises a first field effect transistor and a second field effect transistor. Each of the first and second field effect transistors has its source, drain and gate. In the first field effect transistor, the gate is connected to the input of the circuit, the drain is connected to a grounded wiring, and the source is connected to the output of the circuit. In the second field effect transistor, the source is connected to a negative power line for the circuit, and the drain is connected to the output. A predetermined bias voltage is supplied from a biasing stage to the gate of the second field effect transistor.

SUMMARY OF THE INVENTION

Recently, small transistors are used in semiconductor integrated circuits, such as a source follower circuit. The inventor found the following problem: the smaller the transistors in the source follower are, the worse the constant current characteristics of a current source circuit becomes. The inventor conducted investigation to improve the characteristics of the source follower circuit.

In this investigation, the inventor noted the following. In order to increase the operating speed of a semiconductor integrated circuit containing III–V compound semiconductor transistors, the channel length of the compound semiconductor transistors is shortened. However, the shortening of channel length degrades saturation in the drain current characteristics of compound semiconductor transistors. If the saturation characteristics of the drain current are utilized for obtaining a constant current source, the shortening of channel length decreases the gain of the source follower circuit.

The inventor then conducted further investigation. In order to maintain the good constant current property of the current source containing the compound semiconductor transistor, the channel length of compound semiconductor transistors can be lengthened in the current source. However, if compound semiconductor transistors have respectively different channel lengths, one compound semiconductor transistor has a threshold voltage different from others in the semiconductor integrated circuit. This variation in the threshold voltages is not preferable in terms of designing of the source follower circuit. Namely, what is desired is a circuit design approach to improving the current source characteristics of the source follower circuit.

It is an object of the present invention to provide a source follower circuit including a current source improved in the constant current property, laser driving apparatus, semiconductor laser apparatus, current-voltage conversion circuit, and light receiving circuit.

The inventor performed various investigations in order to accomplish the above object and has been accomplished the present invention as follows.

One aspect of the present invention is a source follower circuit. The source follower circuit comprises a first III–V compound semiconductor transistor, a biasing stage, and a current source portion. The first III–V compound semiconductor transistor has its source electrically connected to an output of the source follower circuit, its drain, and its gate for receiving an input signal. The biasing stage has means for generating a first bias voltage at a first node, and means for generating a second bias voltage smaller than the first bias voltage at a second node. The current source portion comprises a second III–V compound semiconductor transistor. The second III–V compound semiconductor transistor has its source, its drain, and its gate for receiving the second bias voltage. A third III–V compound semiconductor transistor has its source, its drain electrically connected to the output, and its gate for receiving the first bias voltage, and is provided between the current source portion and the output.

This source follower circuit may have the following configuration: the third compound semiconductor transistor has a coupling capacitance $C_{gd3}$ between the gate and drain thereof and the second compound semiconductor transistor has a coupling capacitance $C_{gd2}$ between the gate and drain thereof. The third compound semiconductor transistor is provided such that a value of the coupling capacitance $C_{gd3}$ is smaller than that of the coupling capacitance $C_{gd2}$.

Another aspect of the present invention is a source follower circuit. The source follower circuit comprises a source follower stage and a biasing stage. The source follower stage comprises first, second, and third compound semiconductor transistors. These transistors are connected in series between a first power line and a second power line. Each of the first, second, and third compound semiconductor transistors has its source, drain, and gate. The biasing stage has first and second nodes and a first circuit portion. A first bias voltage is provided at the first node. A second bias voltage is provided the second node. The first circuit portion is provided to generate the second bias voltage smaller than the first bias voltage.

In the source follower circuit, the first, second and third compound semiconductor transistors are electrically connected as follows: the gate of the first compound semiconductor transistor is coupled to an input of the source follower circuit. The source of the first compound semiconductor transistor is coupled to an output of the source follower circuit. The gate of the second compound semiconductor transistor is electrically connected to the second node. The gate of the third compound semiconductor transistor is electrically connected to the first node. The third compound semiconductor transistor is provided between the source of the first compound semiconductor transistor and the drain of the second compound semiconductor transistor.

Still another aspect of the present invention is a laser driving apparatus. The laser driving apparatus comprises first and second source follower circuits and a differential transistor pair circuit. The differential transistor pair circuit has a pair of compound semiconductor transistors and a current source. Each compound semiconductor transistor has its source, a drain, and a gate, and they are connected with each other so as to constitute a differential pair. The current source is connected to the sources of the pair of compound semiconductor transistors. An output of the first source follower circuit is electrically connected to the gate of one transistor of the pair of compound semiconductor transistors. An output of the second source follower circuit is electrically connected to the gate of the other transistor of the pair of compound semiconductor transistors.

Still another aspect of the present invention is a semiconductor laser apparatus. The semiconductor laser apparatus comprises the laser driving apparatus and a semiconductor laser. The semiconductor laser has an anode and a cathode. The drain of one transistor of the pair of compound semiconductor transistors in the differential pair circuit is electrically connected to one of the anode and cathode of the semiconductor laser. The drain of the other transistor of the pair of compound semiconductor transistors in the differential pair circuit is electrically connected to a reference potential line. The other of the anode and cathode of the semiconductor laser is electrically connected to the reference potential line.

Still another aspect of the present invention is a current-voltage conversion circuit. The current-voltage conversion circuit comprises a preamplifier. The preamplifier has an input, an output, an amplification portion, and a feedback portion. The input is provided to receive a current signal. The amplification portion is provided between the input and output. The amplification portion comprises the source follower circuit. The feedback portion connects the output to the input.

Still another aspect of the present invention is a light receiving circuit. The light receiving circuit comprises a photodiode and the preamplifier. An input of the amplification portion is connected to one of the anode and cathode of the photodiode.

In the source follower circuit as described above, the output voltage of the source follower circuit varies in response to a voltage at the gate of the first transistor. This variation causes the voltage variation at the drain of the third transistor as well. Assuming that the second transistor does not have any influence on the third transistor, the drain current of the third transistor varies according to its drain current characteristics in response to the variation in the drain voltage of the third transistor.

This drain current flows through the second transistor. In order to pass this current through the second transistor, the drain voltage of the second transistor varies according to its drain current characteristics. If the drain current is increased by the output voltage, the increase of the source-drain voltage in the second transistor causes the source-gate voltage of the third transistor to decrease. This decrease reduces the drain current change caused by the output change in the third transistor. Thus, the increase of the drain current caused by the output voltage change becomes smaller than the variation of the drain current in a current source consisting of the second transistor. Therefore, the constant current characteristic of the current source is improved in the source follower circuit. This improvement provides the source follower circuit with the gain increase. On the other hand, when the drain current is decreased by the output voltage, the operation of the source follower circuit can be described in a similar way.

This improved gain increases signal amplitudes at the output of the source follower circuit. This increase in amplitude can reduce the potential difference between the gate and source of the first transistor. However, the first transistor has a coupling capacitance between the gate and source thereof. Current is necessary to charge this coupling capacitance because the coupling capacitance should be charged in response to the output variation. However, the charging current has become smaller because of the reduction of the potential difference between the gate and source.

The third transistor is arranged between the output of the source follower circuit and the second transistor. Because of this arrangement, the coupling capacitance between the output and the drain of the third transistor is smaller than that between the output and the gate of the second transistor. Therefore, the third transistor can decrease a capacitance added to the output of the source follower circuit even when the source follower circuit is provided with a desired current source.

BRIEF DESCRIPTION OF THE DRAWINGS

The above object and other objects, features, and advantages of the present invention will become more readily understood from the detailed description of preferred embodiments of the present invention which will be given with reference to the accompanying drawings. The embodiments of the present invention will be described hereinafter with reference to the drawings, in which.

DESCRIPTION OF THE PREFERRED EMBODIMENTS

The embodiments of the present invention will be described with reference to the accompanying drawings.

The same portions will be denoted by the same reference symbols, if possible.
(First Embodiment)

Figure 1A:
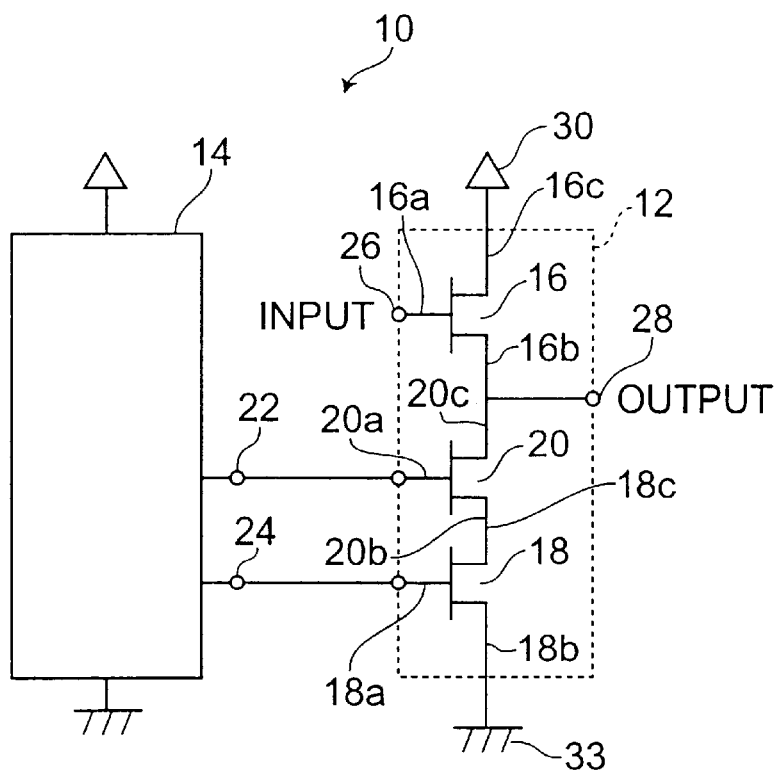
FIG. 1A is a circuit diagram of the source follower stage according to an embodiment of the present invention.

FIG. 1A shows a source follower circuit 10 according to the present embodiment. In the following description, the compound semiconductor field effect transistors are assumed to be, for example, n-type GaAs semiconductor field effect transistors, but they should not be limited to this example. The source follower circuit 10 comprises a source follower stage 12 and a bias stage 14. The source follower stage 12 has first, second, and third III–V compound semiconductor transistors 16, 18 and 20 and each transistor has a source, a drain, and a gate thereof. The bias stage 14 has a first node 22 for providing a first bias voltage, and a second node 24 for providing a second bias voltage. The bias stage 14 has a circuit portion, configured to provide the first node 22 with a voltage different from that at the second node 24, or means for generating the voltage at the first node 22. This circuit portion can be arranged between the first node 22 and the second node 24 and can includes a passive element(s), such as a resistor, and/or an active semiconductor device(s), such as a diode or a transistor, for generating a potential difference between the first node 22 and the second node 24. The first bias voltage is higher than the second bias voltage. For this reason, the above means may have a level shifting portion including one or more diodes, for example. In the circuit shown in FIG. 1A, the voltage at the first node 22 is higher than the voltage at the second node 24.

In the present embodiment, the source follower stage 12 has the following configuration. The gate 16a of the first III–V compound semiconductor transistor (which will be referred to hereinafter as the first transistor) 16 is coupled to an input 26. The source 16b of the first transistor 16 is coupled to an output 28. The gate 18a of the second III–V compound semiconductor transistor (which will be referred to hereinafter as the second transistor) 18 is connected to the second node 24. The gate 20a of the third III–V compound semiconductor transistor (which will be referred to hereinafter as the third transistor) 20 is connected to the first node 22. The third transistor is arranged between the source 16b of the first transistor 16 and the drain 18c of the second transistor 18.

The drain 18c of the second transistor 18 is connected to the source 20b of the third transistor 20. The source 18b of the second transistor 18 is connected to a reference potential line, e.g., a ground potential line 33. The source 16b of the first transistor 16 is connected to the drain 20c of the third transistor 20. The drain 16c of the first transistor 16 is connected to a reference potential line, e.g., a power potential line 30.

In a preferable circuit design, each of the first to third transistors 16, 18 and 20 has a gate length equal to the others. In this circuit design, each of the first to third transistors 16, 18, 20 has the substantially same gate length.

The present invention is not limited to this embodiment, and may have arrangements of various numbers of transistors connected in series between the source 16b of the first transistor 16 and the drain 18c of the second transistor 18, or may have the bias stage 14 providing respective biases to the gates of these transistors. These biases decrease in order from the first transistor 16 toward the second transistor 18. The bias voltage values are determined between the voltage at the first node 22 and the voltage at the second node 24.

Figure 1B:
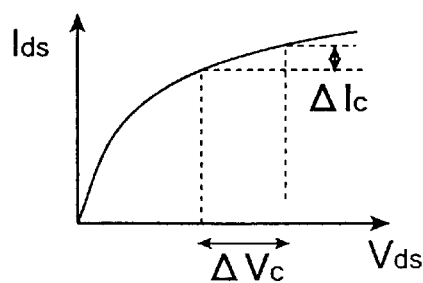
FIG. 1B is a chart showing a drain current characteristics of a single III–V compound semiconductor transistor.
Figure 1C:
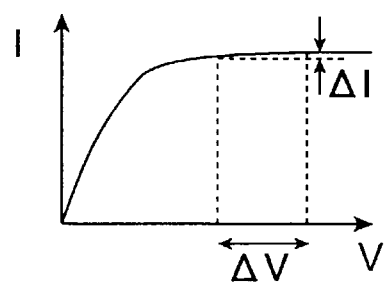
FIG. 1C is a chart showing the current characteristics of the current source portion in FIG. 1A.

FIG. 1B is a chart schematically showing respective drain current characteristics of the second and third transistors 18 and 20. In FIG. 1B, the abscissa represents the source-drain voltage and the ordinate represents the drain current. FIG. 1C is a chart schematically showing the voltage-current characteristics of the combined transistors. In this chart of current characteristics, the abscissa represents the voltage applied between the both ends of the combined transistors and the ordinate represents the current supplied from the current source portion. The second and third transistors 18 and 20 are connected in series to constitute a combination of the transistors.

FIG. 1B shows a drain current characteristic of a single transistor. In this case, the current characteristic of the current source is expressed by ($\Delta Ic/\Delta Vc$) against a voltage applied between the source and drain of the transistor. On the other hand, an additional transistor is arranged between the current-source transistor and the source follower transistor to constitute the combination of transistors consisting of the transistor 18 and the additional transistor 20. This combination exhibits the current characteristic shown in FIG. 1C. In the combination, the current characteristic against a voltage applied between the nodes 20c and 18b in FIG. 1A, corresponding to both ends of the combined transistors, is expressed by ($\Delta I/\Delta V$). The relationship indicating that ($\Delta Ic/\Delta Vc$) is greater than ($\Delta I/\Delta V$), i.e., ($\Delta Ic/\Delta Vc$) >($\Delta I/\Delta V$), is satisfied herein.

This relationship is understood in a following way. The second and third transistors 18 and 20 are biased so as to act in the so-called saturation region. In each of the second and third transistors 18 and 20 acting in the saturation region, the gate-source voltage causes a dominant change of the drain current ideally. However, the drain current of each transistor demonstrates the source-drain voltage dependence on the source-drain voltage due to the short channel effect thereof, as shown in FIG. 1B, and the variation arising from this dependence can not be negligible. This dependence indicates that the current value of the current source, acting as a load varies with the output voltage.

In the present embodiment, when the current of the current source increases in response to a rise of the output voltage, the source-drain voltage of the second transistor 18 needs to increase in order to allow this incremental current to flow therethrough. This causes the source-gate voltage of the third transistor 20 to decrease. This decrease prevents the current of the current source portion from increasing. Namely, the second transistor 18 acts to implement negative feedback to the third transistor 20. The transistor 18 rather than the transistor 20 substantially determines the value of current supplied from the current source. The transistor combination, consisting of the second and third transistors 18 and 20, receives the respective different gate biases and one transistor is thought to act as a current-source transistor and the other transistor is thought to act as a transistor for separating this current source from the output, respectively.

In the source follower circuit 10, the current source acts so as to flow a certain amount of current. The increase in the voltage at the input 26 causes the voltage at the output 28 to increase. Ideally, it is desirable that the current from the current source is independent of the voltage at the output 28 because the dependence of the current of the current source on the output voltage cancels out a part of voltage change caused by the transistor 16 in response to voltages at the input 26. This output voltage dependence means decrease in gain. However, since the source follower circuit of the present embodiment satisfies the relationship indicating that ($\Delta Ic/\Delta Vc$) is greater that ($\Delta I/\Delta V$), i.e., ($\Delta Ic/\Delta Vc$)>($\Delta I/\Delta V$), the current change in the current source is small against the input voltage change. This allows the gain to increase in the source follower circuit.

Figure 2A:
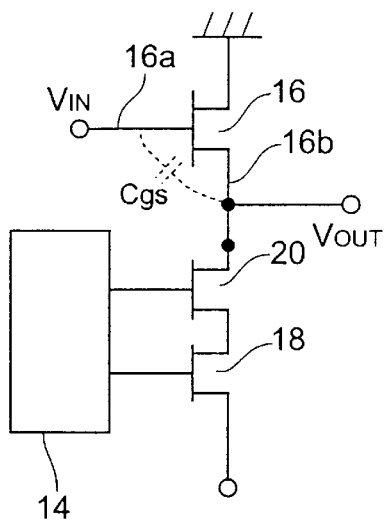
FIG. 2A is a schematic circuit diagram of the source follower circuit.
Figure 2B:
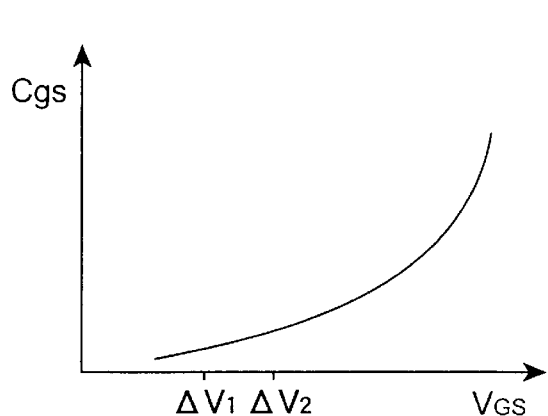
FIG. 2B is a view showing $V_{GS}$ dependence of $C_{gs}$.

Referring to FIGS. 2A to 2D, the advantage brought about by this gain increase will be described. There exists the coupling capacitance $C_{gs}$ between the gate and the source of the first transistor 16. As shown in FIG. 2B, this coupling capacitance $C_{gs}$ monotonically increases with increase in the gate-source voltage $V_{GS}$.

Figure 2C:
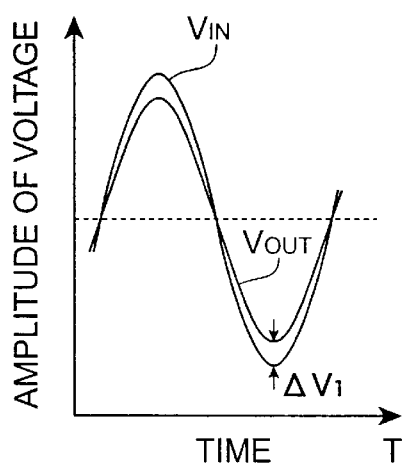
FIG. 2C is a view showing signal waveforms in the source follower circuit according to the embodiment of the present invention.
Figure 2D:
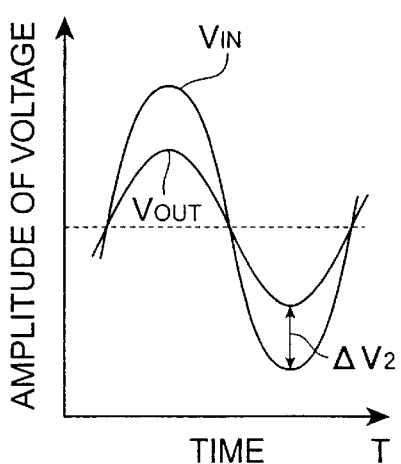
FIG. 2D is a view showing signal waveforms in the source follower circuit for the purpose of comparison.

FIG. 2C shows waveforms at the output and input of the source follower circuit 10 according to the present embodiment. In the source follower circuit shown in FIG. 1A, the increase in gain enables the signal amplitude to increase at the output thereof. Because of this gain increase, the difference between the input signal and output signal becomes $\Delta V_1$. FIG. 2D shows waveforms at the output and input in the source follower circuit for comparison (e.g., a circuit shown in FIG. 5). Since there is no gain increase, the difference between the input signal and output signal becomes $\Delta V_2$.

Since $\Delta V_1$ is smaller than $\Delta V_2$, the potential difference between the gate 16a and the source 16b is reduced in the first transistor 16 in the circuit of the present embodiment. Although the capacitance $C_{gs}$ is charged according to the change of the potential difference between input and output, the current for charging the capacitance $C_{gs}$ becomes smaller.

Then, referring to FIG. 2B, the smaller the voltage $V_{GS}$ is, the smaller the capacitance $C_{gs}$ becomes. Since the coupling capacitance $C_{gs}$ becomes smaller, the current for charging the coupling capacitance $C_{gs}$ is smaller as well.

For these two reasons, the bandwidth of the source follower circuit is expanded.

FIGS. 3A to 3F show various bias stages 14 that can be applied to the source follower circuit 10.

Figure 3A:
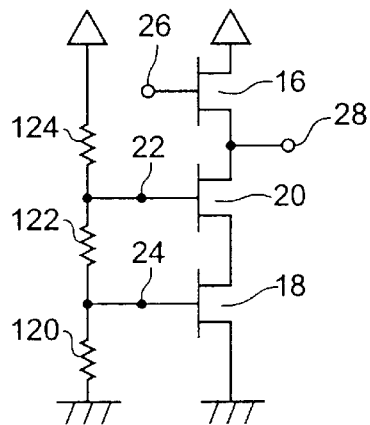
FIGS. 3A to 3F are circuit diagrams showing various bias circuits available for the source follower stage according to the embodiment.

Referring to FIG. 3A, the bias stage 14 is provided with at least one resistor 120 between the ground potential line and the second node 24, at least one resistor 122 between the first node 22 and the second node 24, and at least one resistor 124 between the first node 22 and the power potential line. The bias stage 14 includes these resistors connected in series and supplies potentials for biasing, generated by dividing the power-source voltage by these resistors, to the first and second nodes 22 and 24, thereby providing the potential difference between the two nodes 22 and 24. This circuit can readily provide the two types of bias voltages necessary for the source follower stage 12. The voltages at the first and second nodes 22, 24 are determined so as to allow the second and third transistors to act in the saturation region. In the bias stages described below, these voltages are also determined in the same way.

Figure 3D:
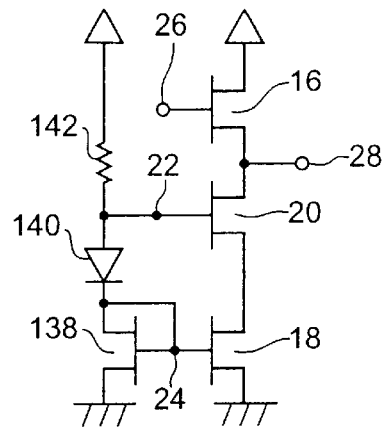
Figure 3B:
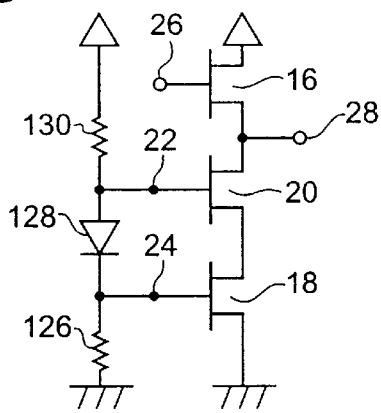

Referring to FIG. 3B, the bias stage 14 is provided with at least one resistor 126 between the ground potential line and the second node 24, at least one diode 128 between the first node 22 and the second node 24, and at least one resistor 130 between the first node 22 and the power potential line. This bias stage generates a potential difference between the first and second nodes arising from a voltage difference across the diode. This circuit can generate the bias voltage at the second node 24 which has an almost constant potential difference from the voltage at the first node 22. Since the voltages supplied to the first and second nodes 22 and 24 are generated from the voltage across the diode, they are stable against variation of the power supply.

Figure 3E:
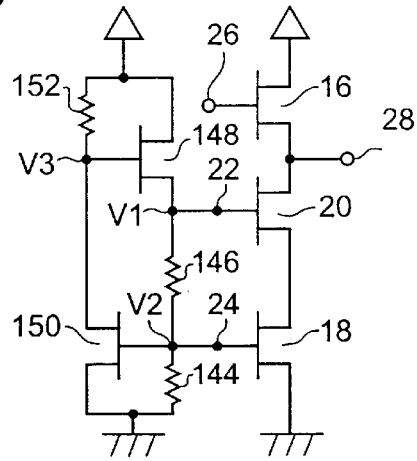
Figure 3C:
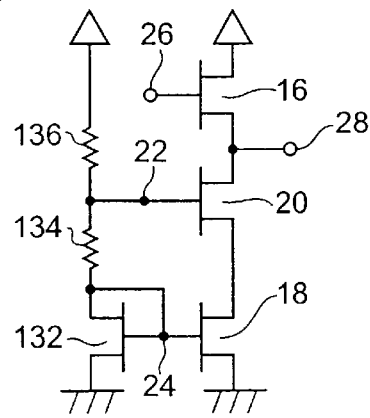

Referring to FIG. 3C, the bias stage 14 is provided with a transistor 132 between the ground potential line and the second node 24, at least one resistor 134 between the first node 22 and the second node 24, and at least one resistor 136 between the first node 22 and the power potential line. The gate and drain of the transistor 132 are connected to the second node 22. Since the type of the transistor 132 is the same as that of the transistor 18, their gate-source voltage changes due to temperature change are cancelled out each other. Because of this cancellation, this source follower circuit has excellent temperature characteristics. The bias voltage necessary for the first node 22 is generated by the resistors 136 and 134. This circuit can be suitably applied to enhancement type transistors.

In the bias stage 14, the transistor 132 and the transistor 18 constitute a current mirror circuit unit. The drain current flowing in the transistor 132 is determined by the resistors 134, 136 connected in series between the drain of the transistor 132 and the power potential line. The resistor 136 works as a current source. The resistor 134 acts to generate the potential difference between the first and second nodes 22 and 24. A gate voltage necessary to flow this drain current is supplied through the second node 24 to the transistor 18 such that the transistor 18 acts in the saturation region. In this configuration, the transistor 18 can feed a current in direct proportion to current flowing through the transistor 132 and in accordance with the dimensional ratio between the transistor 18 and the transistor 132.

Referring to FIG. 3D, the bias stage 14 comprises a transistor 138 between the ground potential line and the second node 24, at least one diode 140 between the first node 22 and the second node 24, and at least one resistor 142 between the first node 22 and the power potential line. The drain current flowing in the transistor 138 is determined by the resistor 142 and the diode 142 connected in series between the drain of the transistor 138 and the power potential line. The resistor 142 acts as a current source. The diode 142 acts to generate the potential difference between the first and second nodes 22 and 24 and the gate and drain of the transistor 138 are connected to the second node 24. In this circuit, since the type of the transistor 138 is the same as that of the transistor 18, changes in their gate-source voltage due to temperature change are cancelled out each other. Because of this cancellation, the first node 22 is provided with a voltage having an almost constant potential difference from the voltage at the second node 24, and thus this configuration provides the source follower circuit with excellent temperature characteristics. In the bias stage 14, the transistors 138 and 18 constitute a current mirror circuit unit as in FIG. 3C.

Referring to FIG. 3E, the bias stage 14 comprises at least one resistor 144 between the ground potential line and the second node 24, at least one resistor 146 between the first node 22 and the second node 24, and a transistor 148 between the first node 22 and the power potential line. The voltage at the first node is divided by the resistors 144 and 148 to generate the voltage at the second node 24.

In the bias stage 14, the gate of a transistor 150 is connected to the gate of the transistor 18, and the voltage at the second node 24 is applied to the both gates of the transistors 18 and 150. The transistor 150 acts in the saturation region as the transistor 18 does. The source of the transistor 150 is connected to the reference potential line, and the drain thereof is connected to the gate of the transistor 148. The resistor 144 provides the gate of the transistor 150 with the potential variation at the second node 24. The transistor 152 provides the gate of the transistor 158 with the potential variation at the second node 24 through a resistor 152. This enables the drain current of the transistor 158 to change so as to cancel the variation of the potential at the second node 24.

In this circuit, if the types of the transistors 148 and 150 are the same as that of the transistor 18, the source-gate voltages of the transistors 150 and 18 change with temperature and their changes are canceled out each other. Because of this cancellation, the present configuration can provide the source follower circuit with excellent temperature characteristics. When the transistor 148 operates to provide the drain of the transistor 150 with a voltage higher than that at the gate of transistor 150, the transistor 150 will act in the saturation region even if the transistor 150 has a depletion type. The bias voltage for the second node 24 can be generated by dividing the voltage at the first node 22 by the resistors 146, 44. Therefore, this circuit can be applied to depletion type transistors.

Figure 3F:
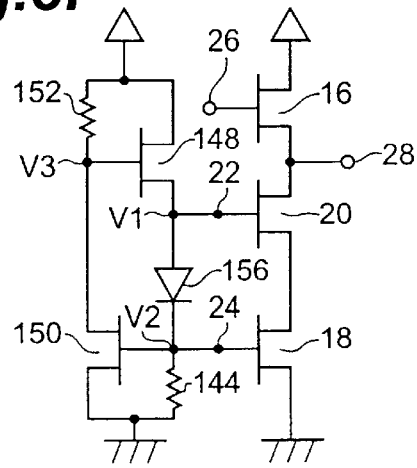

Referring to FIG. 3F, the bias stage 14 comprises a resistor 154 between the ground potential line and the second node 24, at least one diode 156 between the first node 22 and the second node 24, and a transistor 158 between the first node and the power potential line. The voltage for the second node 24 is generated by dividing the voltage at the first node 22 by the diode 156 and the resistor 144.

In this circuit, if the transistors 148 and 150 have the same type as the transistor 18, the circuit has advantages similar to those in the circuit shown in FIG. 3E. This circuit can be applied to depletion type transistors.

In the bias stage 14, the gate of the transistor 150 is connected to the gate of the transistor 18, as in the circuit of FIG. 3E. The transistor 150 acts in the saturation region as the transistor 18 does. The source of the transistor 150 is connected to the reference potential line and the drain thereof to the gate of the transistor 148.

In the bias stages of FIG. 3E and FIG. 3F, assuming that the voltages V1 and V2 increase at the first and second nodes, the increase of the voltage V2 at the second node is applied to the gate of the transistor 150. Since the transistor 150 operates in the saturation region, the drain current increases in the transistor 150. This lowers the gate voltage V3 of the transistor 148. This decreases the voltage V1 at the first node, thereby decreasing the voltage V2 at the second node. Therefore, even if the voltages V1 and V2 increase at the first and second nodes, feedback mechanism works in these bias stages so as to suppress their variations. These source follower circuits are provided with the depletion type transistors and the gate lengths thereof are set to the same value in view of circuit design.

These bias circuits can be integrated with the source follower circuit to form one chip. Electrical elements formed on the same chip have excellent relative accuracy as to transistor characteristics including electrical and temperature characteristics. As described above, the current mirror circuit is applied to the circuits of FIG. 3C to FIG. 3F. Therefore, the current sources receiving the bias voltages from these bias stages have excellent characteristics, e.g., excellent temperature characteristics. It is easy for those skilled in the art to modify the circuits of FIGS. 3A to 3F so as to provide three or more different bias voltages.

Figure 4:
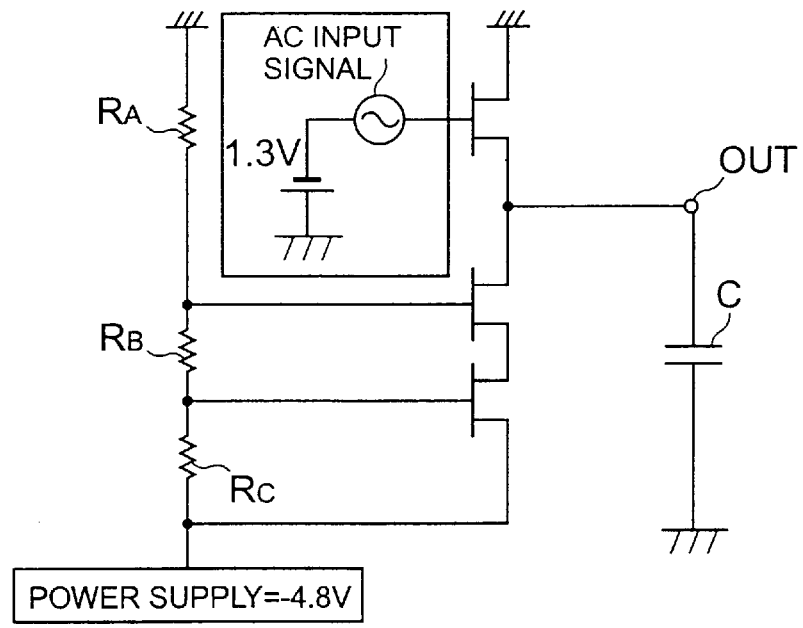
FIG. 4 is a circuit diagram showing the source follower circuit according to the embodiment of the invention.
Figure 5:
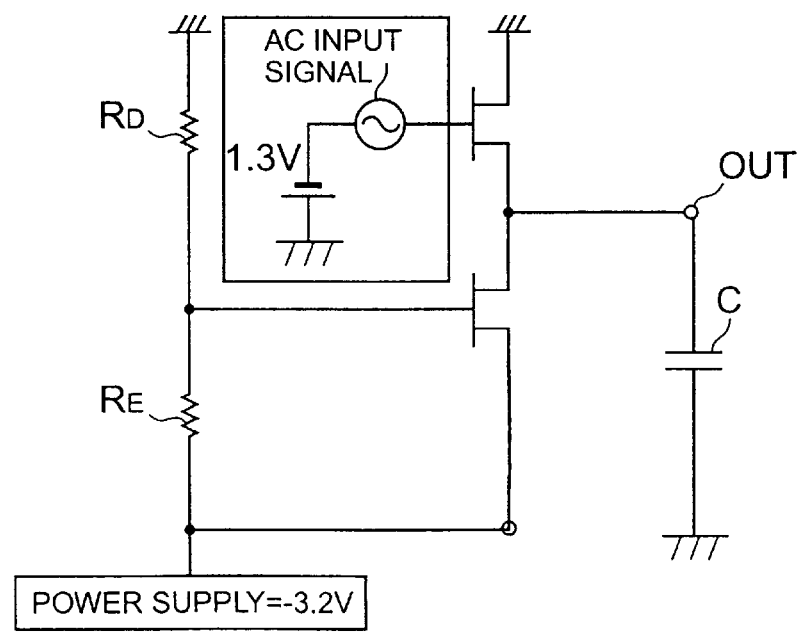
FIG. 5 is a circuit diagram showing an example of the source follower circuit for the purpose of comparison.
Figure 6:
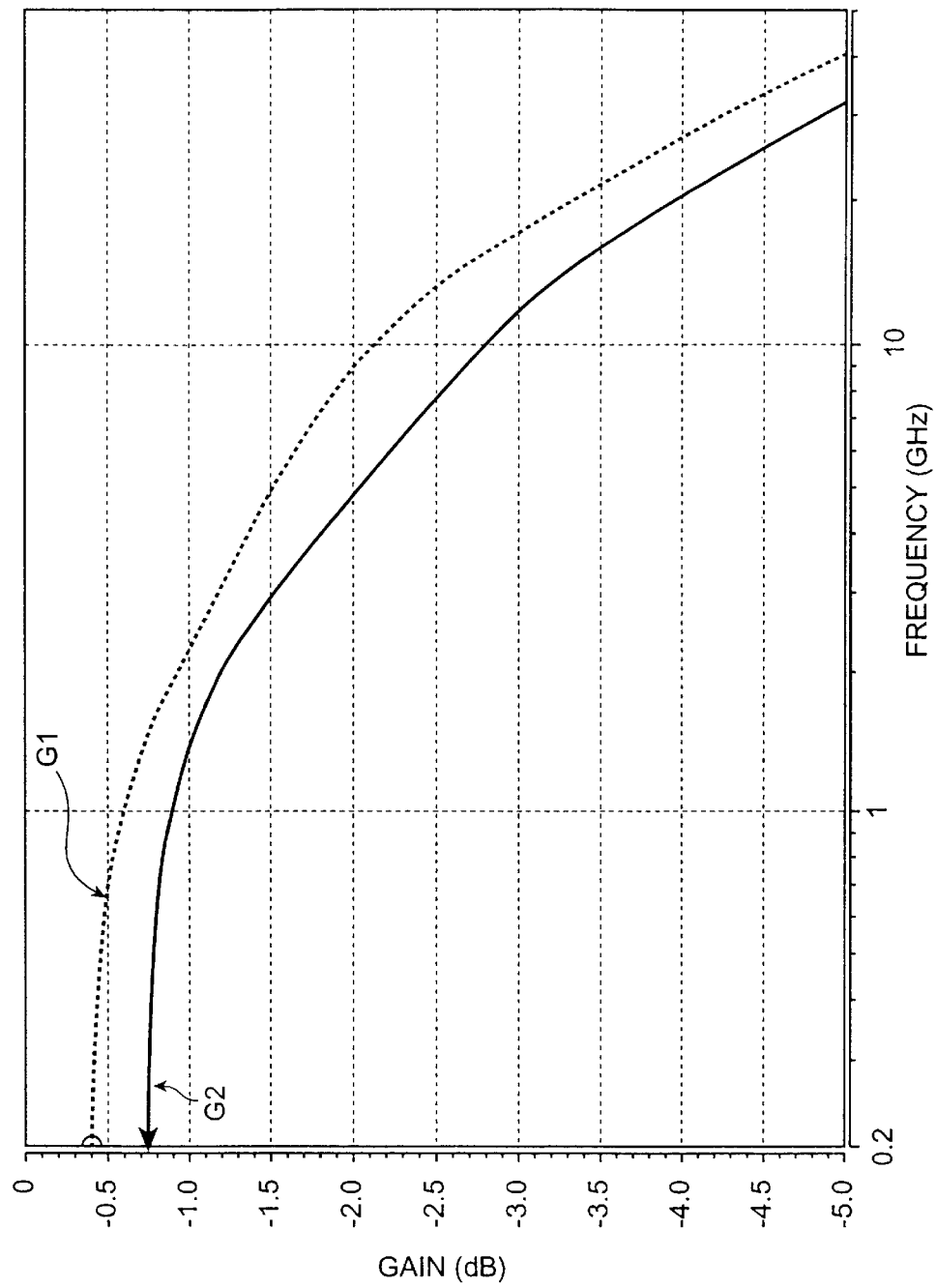
FIG. 6 is a chart showing frequency characteristics of the gains of the respective circuits shown in FIGS. 4 and 5.

FIG. 4 is a circuit diagram of an example of the source follower circuit according to the present embodiment. FIG. 5 is a circuit diagram of a source follower circuit for comparison. FIG. 6 is a chart showing frequency characteristic of gains in the circuits of FIGS. 4 and 5. Depletion n-type transistors having the same channel width and channel length are used in each of the circuits in FIGS. 4 and 5, a load capacitance of C=0.1 pF is at the output OUT, and the gate of the source follower transistor, i.e., the input, is connected to a dc voltage supply of −1.3 V and a frequency-variable sinusoidal voltage source. In the circuits of FIGS. 4 and 5, $R_A$=2900 Ω, $R_B$=1600 Ω, $R_C$=300 Ω, $R_D$=2900 Ω, and $R_E$=300 Ω are used.

The circuit in the present embodiment can obtain the increase in dc gain and the frequency characteristics are also improved, as compared with the comparative circuit. FIG. 6 shows the characteristics of the circuit according to the present embodiment in dashed line G1. The circuit achieves a gain of Gv=−0.39 dB at a frequency of 200 MHz. FIG. 6 also shows the characteristics of the comparative circuit in solid line G2. The circuit has a gain of Gv=−0.73 dB at a frequency of 200 MHz.

(Second Embodiment)

Figure 7:
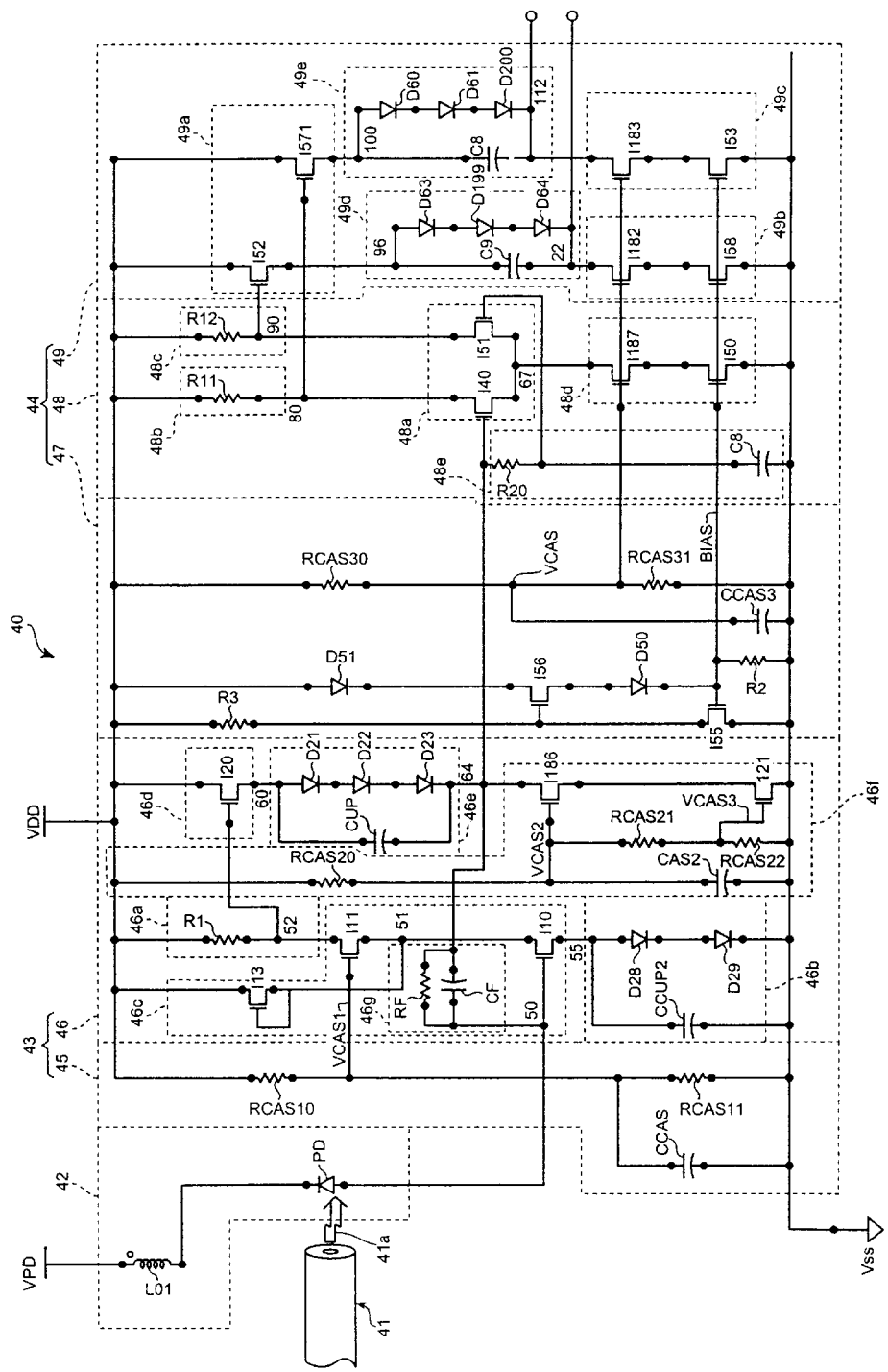
FIG. 7 is a circuit diagram of a light receiving circuit according to an embodiment of the present invention.

FIG. 7 is a circuit diagram containing a current-voltage conversion circuit and a light receiving circuit to which the source follower circuit of the first embodiment can be used. The light receiving circuit 40 of the present embodiment comprises a light receiving portion 42, an amplification portion 43, and a differential output portion 44. In the circuits described, the n-type enhancement type transistors are adopted unless otherwise stated.

The light receiving portion 42 has a light receiving element, such as a photodiode PD. The light receiving element receives a light signal 41a through an optical waveguide 41, such as an optical fiber. A pin photodiode can be used as the photodiode PD. The cathode of the photodiode PD is connected through an inductance L01 to a photodiode power line VPD and the anode thereof is connected to an input of the amplification portion 43.

The amplification portion 43 has a bias stage 45 and an amplification stage 46. The bias stage 45 is connected between a reference potential line VDD and a reference potential line VSS, and supplies a bias voltage to a node VCAS1. The bias stage 45 has resistors RCAS10 and RCAS11 to supply this voltage. These resistors RCAS10 and RCAS11 are connected between the reference potential lines VDD and VSS and the node VCAS1, respectively. A capacitor CCAS for stabilizing the bias voltage is electrically connected to the node VCAS1.

The amplification stage 46 works as an inverting amplifier and has a first amplification portion and a source follower portion. The first amplification portion includes a load portion 46a, a source bias portion 46b, and a driving portion 46c. The load portion 46a has a resistor R1 arranged between the reference potential line VDD and a node 51. The load portion 46a includes the resistor R1. The source follower stage comprises a signal receiving portion 46d, a level shifting portion 46e, and a current source portion 46f. A feedback portion 46g is connected between the input 50 and an output 64 of the amplification stage 46 and has a resistor RF and a resistor CF connected in parallel.

In the first amplification portion, the driving portion 46c has transistors I10, I11, I13. The transistor I10 has a source, a drain and a gate thereof. The gate of the transistor I10 receives a current signal from the photodiode PD at the node 50. The source of the transistor I10 is connected at the node 55 through the source bias portion 46b to the reference potential line VSS. The drain of the transistor I10 is connected at the node 51 to the source of the transistor I11 and is also connected through the transistor I11 to the load 46a. The source of the transistor I11 is connected at the node 51 to the drain of the transistor I10. The drain of the transistor I11 is connected at the node 52 to one end of the load portion 46a. The gate of the transistor I11 is connected to the node VCAS1 and receives a bias voltage from the bias stage 45. The transistor I11 allows the output resistance of the driving portion 46c to increase. The drain of the transistor I13 is connected to the reference potential line VDD. The source and gate of the transistor I13 are connected at the node 51 to the source of the transistor I11 and to the drain of the transistor I10. The transistor I13 is a depletion type transistor.

In the first amplification portion, the source bias portion 46b has a plurality of diodes, for example two diode D28 and D29, connected in series between the node 55 and the reference potential line VSS, and a bypass capacitor CCUP2 connected in parallel to these diodes D28 and D29. The number of diodes is determined to adjust the source potential of the transistor I10 with the signal level supplied to the gate.

In the source follower portion, the signal receiving portion 46d includes a transistor I20. The drain of the transistor I20 is connected to the first reference potential line VDD, and the source thereof is connected through the level shift portion 46e to the current source portion 46f. The gate of the transistor I20 is connected to a junction node 52 between the load 46a and the driving portion 46c and receives a signal from the first amplification stage.

A configuration of the level shifting portion 46e can be selected according to electrical characteristics required for respective circuits. The level shifting portion 46e has one or more diodes, e.g., three diodes D21, D22, D23, connected in series. The diodes are connected so as to be biased in the forward direction to form a device having diode characteristic. A capacitor CUP is connected parallel to the diode characteristic device. The capacitor CUP operates to stabilize the level shifting voltage. One end of the diode characteristic device is connected at a node 60 to the source of the transistor I20 and the other end is connected at a node 64 to the current source portion 46f.

The current source portion 46f is provided with transistors I186 and I21, biasing resistors RCAS20, RCAS21 and RCAS22, and a capacitor CAS2. The transistor I186 and the transistor I21 are connected in series. In the current source portion 46f, the drain of the transistor I21 is connected to the source of the transistor I186, and the source thereof is connected to the second reference potential line. The gate of the transistor I21 is connected to a junction VCAS3 between the resistors RCAS21 and RCAS22, which are connected in series so as to generate a bias voltage. In the current source portion 46f, the drain of the transistor I186 is connected at the node 64 to the level shifting portion 46e and the gate thereof is connected to a junction VCAS2 between the resistors RCAS20 and RCAS21, which are connected in series so as to generate a bias voltage. The capacitor CAS2 is connected between the node VCAS2 and a reference potential line, e.g., either of reference potential line VDD and VSS, and acts to stabilize the bias voltage. The bias voltage is determined so as to allow the transistor I186 to operate in the saturation region. Since the transistor I21 is arranged at the source of the transistor I186, this circuit configuration can expand the voltage range, i.e., the range of voltage at the node 64, in which the current source portion 46f demonstrates the constant current property.

As seen from the above description, the current-voltage conversion circuit comprises the first amplification portion, the source follower portion, and the feedback portion 46g. The current-voltage conversion circuit converts the current signal from the photodiode PD to a voltage signal to provide the voltage signal at the node 64.

The differential output portion 44 comprises a bias stage 47, a differential amplification stage 48, and a source follower output stage 49. The differential amplification stage 48 has a differential pair portion 48a including transistors I40 and I51, and the sources of these transistors I40 and I51 are connected to each other so as to constitute a differential pair. The drain of the transistor I40 is connected at a node 80 to one end of load 48b including a resistor R11, and the other end of load 48b is connected to the first reference potential line VDD. The drain of the transistor I51 is connected at a node 90 to one end of load 48c including a resistor R12, and the other end of the load 48c to the first reference potential line VDD.

In the differential pair portion 48a, the gate of the transistor I40 receives a signal from the node 64 in the amplification stage 46, and the gate of the transistor I51 receives a signal from the node 64 in the amplification stage 46 through a low-pass filter portion 48e. The low-pass filter portion 48e is connected between the gates of the transistors I40 and I51. For the low-pass filter portion 48e, a resistor R20 is provided between the gates of the transistors I40 and I51; one end of a capacitor C8 is connected between the gates of the transistors I40 and I51; and the other end of the capacitor C8 to the predetermined reference potential line.

The sources of the transistors I40 and I51 constituting the differential pair portion 48a are connected at a node 67 to one end of a current source portion 48d, i.e., to the drain of transistor I187. The current source portion 48d has transistors I187 and I50 connected in series. The source of the transistor I50 is connected to the reference potential line VSS. The transistor I50 is connected between the differential pair portion 48a and the reference potential line VSS. The transistor I187 is connected between the transistor I50 and the reference potential line VSS.

The source follower output stage 49 includes one or two source follower stages receiving the corresponding output(s) from nodes 80 and/or 90 of the differential amplification stage 48. In this circuit, a signal receiving portion 49a includes transistors I52 and I571. These transistors I52 and I571 receive outputs from the nodes 80 and 90 of the differential amplification stage 48 at their gates, respectively. The drains of these transistors I52 and I571 are connected to the reference potential line VDD. The sources of transistor I52 and I571 are electrically connected to one ends of the corresponding current source portions 49b and 49c, respectively. The other ends of the respective current source portions 49b and 49c are electrically connected to the reference potential line VSS.

The level shifting portions 49d and 49e should be configured according to the characteristics required for the respective circuits. The level shift portion 49d has one or more diodes connected in series, e.g., three diodes D63, D199, D64. The level shift portion 49e has one or more diodes connected in series, e.g., three diodes D60, D61, D200. Each of the three diodes D63, D199, D64 and the three diodes D60, D61, D200 is connected in series so as to be biased in the forward direction to form a diode characteristic device. Capacitors C8 and C9 are connected across the diode characteristic devices, respectively. These capacitors C8 and C9 work so as to stabilize the level shifted voltage.

One end of one diode characteristic device, including the diodes D63, D199, D64, is connected at a node 96 to the source of the transistor I52, and the other end is connected at a node 22 to one end of the current source portion 49b. One end of the other diode characteristic device, including the diodes D60, D61, D200, is connected at a node 100 to the source of the transistor I571, and the other end is connected at a node 112 to one end of the current source portion 49c. The other ends of the respective current source portions 49b and 49c are connected to the reference potential line VSS.

The bias stage 47 supplies biasing voltages to the tandem transistors I187 and I50 in the differential amplification portion 48 and to the tandem transistors I182 and I58 and the tandem transistors I183 and I53 in the source follower portion 49. These voltages allow these tandem transistors to work as current source sections. The gates of the transistors I187, I182, I183 are connected at a node VCAS to a first bias generating portion. The gates of the transistors I50, I58, I53 are connected at a node BIAS to a second bias generating portion. The first and second bias generating portions, as described below, supply biasing voltages to allow the current source portions to demonstrate good constant current properties.

The first bias generating portion has a resistor RCAS30 and a resistor RCAS31. The resistor RCAS30 is arranged between the node VCAS and the first reference potential line VDD. The resistor RCAS31 is arranged between the node VCAS and the second reference potential line VSS. A capacitor CCAS3 for stabilizing the voltage is connected between the node VCAS and either of these reference potential lines. The bias voltages of the first bias generating portion are determined so as to allow the transistors I187, I182, I183 to act in the saturation region, respectively.

The second bias generating portion has a transistor I55 having its gate connected to the node BIAS. The source of the transistor I55 is connected to the reference potential line VSS, and the drain thereof is connected through a resistor R3 to the reference potential line VDD. The second bias generating portion also has a resistor R2 and a transistor I56. The resistor R2 is arranged between the node BIAS and the second reference potential line VSS and the transistor I56 is arranged between the node BIAS and the first reference potential line VDD. One or more diodes connected in the forward direction, e.g. D50 in the example of FIG. 7, are arranged between the source of the transistor I56 and the node BIAS. One or more diodes connected in the forward direction, e.g. D51 in the example of FIG. 7, are arranged between the drain of the transistor I56 and the reference potential line VDD. The gate of the transistor 56 is connected to a junction between the resistor R3 and the transistor 55. The voltage at the node BIAS is preferably designed at a value $Vt+\alpha$, which is larger than the threshold Vt of the transistors I50, I58, I53, I55 by a value $\alpha$. This permits the transistors I50, I58, I53 and I55 to act in the saturation region and, in turn, to act as current sources. The drain of the transistor I55 is preferably designed to have a value of $2Vt+Vf+\alpha+\beta$ approximately. The voltage Vf indicates a forward voltage drop of the diode. The second bias generating portion is effective to stabilize the voltage at the node BIAS even with variation in the potential difference between the first and second reference potential lines. The output from the light receiving circuit 40 is provided as a differential output at nodes 22, 112.

(Third Embodiment)

Figure 8A:
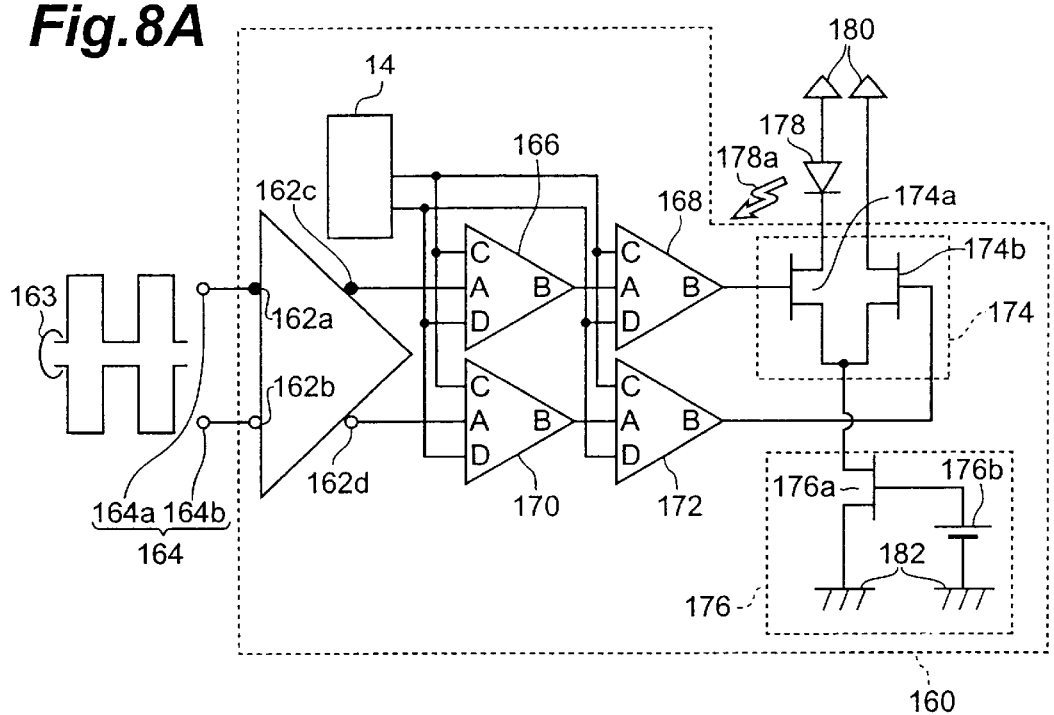
FIGS. 8A and 8B show circuit diagrams of a laser driving circuit and a semiconductor laser apparatus according to embodiments of the present invention, respectively.

FIG. 8A is a circuit diagram of a laser driving circuit and a semiconductor laser apparatus. The source follower circuit of the first embodiment can be applied to the laser driving circuit and the semiconductor laser apparatus.

The laser driving circuit 160 comprises a differential amplifier 162, differential pair transistors 174a and 174b, a current source 176, and source follower stages 166, 168, 170 and 172. The differential amplifier 162 has a pair of inputs 162a and 162b and a pair of outputs 162c and 162d. The current source 176 is connected to the sources of the differential paired transistors 174a and 174b. The source follower stages 166, 168, 170 and 172 are arranged between the pair of differential outputs 162c and 162d of the differential amplifier 162 and the gates of the differential pair transistors 174a and 174b, respectively. A differential signal 163 is entered into the pair of inputs 162a and 162b.

The semiconductor laser apparatus comprises the laser driving circuit 160 and a semiconductor laser 178. The cathode of the semiconductor laser 178 is connected to one transistor 174a of the differentially paired transistors. The anode of the semiconductor laser 178 and the other transistor 174b of the differential paired transistors are connected to a reference potential line 180. The current source 176 has a transistor 176a and a voltage source 176b connected to the gate thereof. The transistor 176a has a drain connected to the sources of the transistors 174a and 174b constituting the differential transistor pair. The voltage of the voltage source 176b is determined so as to allow the transistor 176a to operate in the saturation region. A bias circuit 14 supplies a biasing voltage to each of the source follower stages 166, 168, 170 and 172.

Figure 8B:
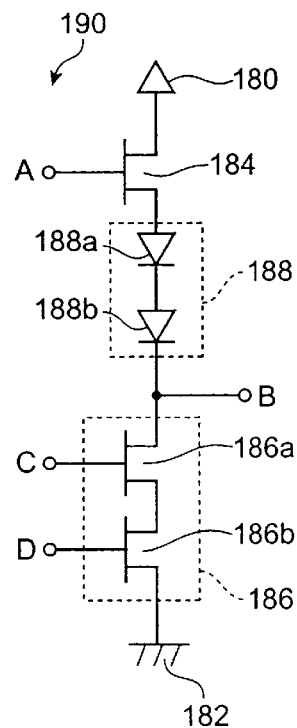

FIG. 8B shows a circuit applicable to the source follower stages 166, 168, 170 and 172 as shown in FIG. 8A. A source follower stage 190 is provided with a transistor 184 receiving the input A, a level shifting portion 188, and a current source portion 186, and these are connected in series between two reference potential lines 180 and 182. The level shifting portion 188 is provided with one or more diodes. These diodes are connected in series. The current source portion 186 is provided with transistors 186a and 186b connected in series, and the gates of these transistors receive their respective biasing voltages from the inputs C and D. A junction between the level shifting portion 188 and the current source portion 186 is connected to the output B.

(Fourth Embodiment)

Figure 9A:
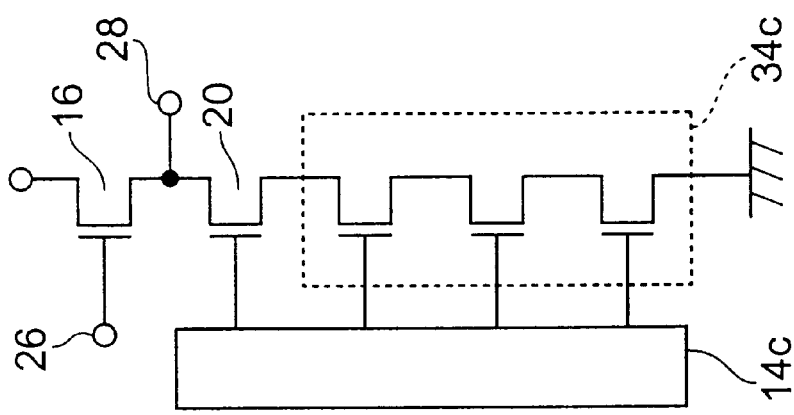
FIGS. 9A to 9C show circuit diagrams of source follower stages according to an embodiment of the present invention, respectively.
Figure 9B:
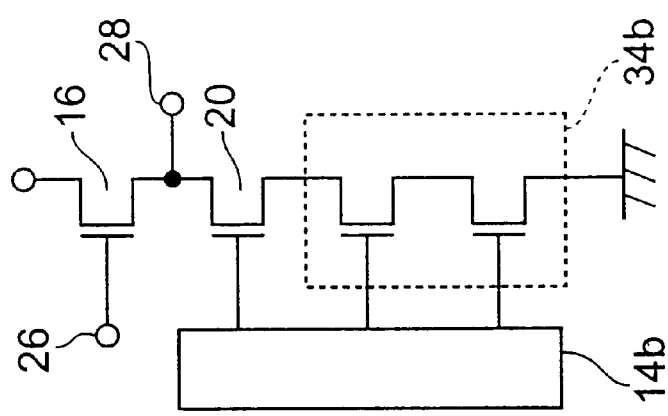
Figure 9C:
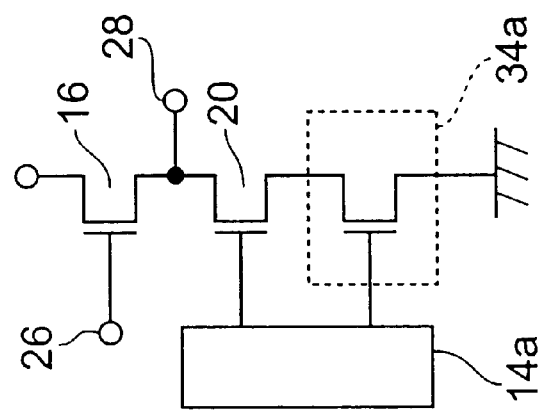

FIGS. 9A to 9C show circuit diagrams of source follower circuits, respectively, each of which includes the current source comprising one or more transistors. Among the source follower stages in FIGS. 9A to 9C, the number of the transistors connected in series is different in respective current sources 34a to 34c, and the different bias stages 14a to 14c are used for the current sources 34a to 34c, respectively.

Figure 10:
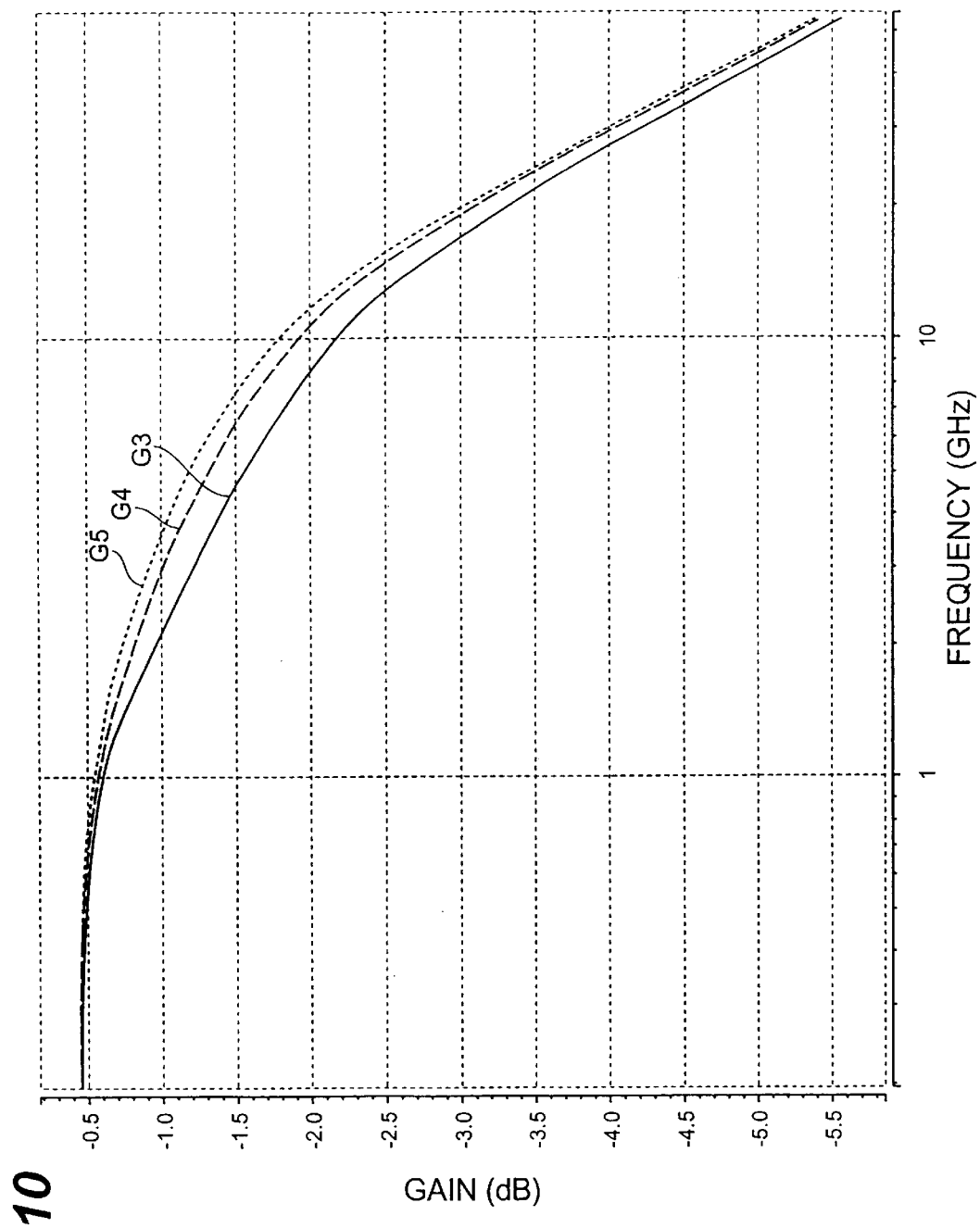
FIG. 10 is a chart showing frequency characteristics of the gains of the respective circuits shown in FIGS. 9A to 9C.

FIG. 10 shows a frequency dependence of gain calculated for each of the source follower circuits shown in FIGS. 9A to 9C. A characteristic curve G3 indicates the calculated gain for the source follower circuit shown in FIG. 9A, a characteristic curve G4 indicates the calculated gain for the source follower circuit shown in FIG. 9B, and a characteristic curve G5 indicates the calculated gain for the source follower circuit shown in FIG. 9C. These circuits represent the following result:

| Number of FET | Gain (dB) | Bandwidth $f_{3dB}$ (GHz) |
| --- | --- | --- |
| 1 (the circuit for comparison) | −0.73 | 19.1 |
| 1 | −0.45 | 20.5 |
| 2 | −0.43 | 22.2 |
| 3 | −0.43 | 22.9 |

This result reveals that the bandwidth is expanded with increase in the number of FETs.

The inventor thinks of the reason of this expansion as follows. With increase in the number of FETs, the constant current characteristic of the current source is further improved. Therefore, the gain of the source follower circuit is increased further.

(Fifth Embodiment)

Figure 11A:
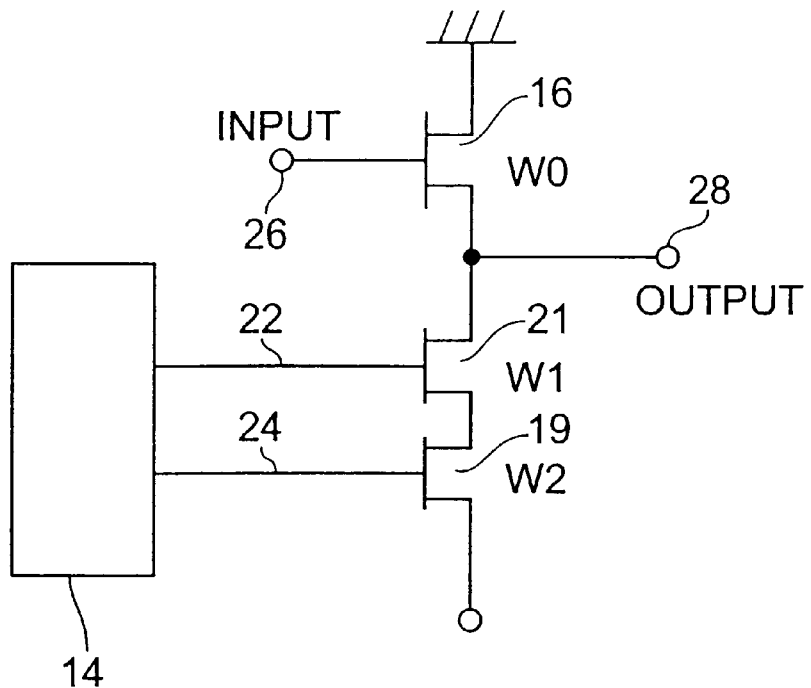
FIG. 11A is a circuit diagram of the source follower stage according to an embodiment of the present invention.

FIG. 11A shows another source follower circuit. In this circuit, the transistors can be different in size from each other. This circuit has transistors 19 and 21, and these transistors 19 and 21 are connected in series and receive respective biasing voltages from nodes 22 and 24 of the bias stage 14. The transistor 19 has its gate width W1 and the transistor 21 has its gate width W2. The source follower transistor 16 has its gate width W0.

Figure 12A:
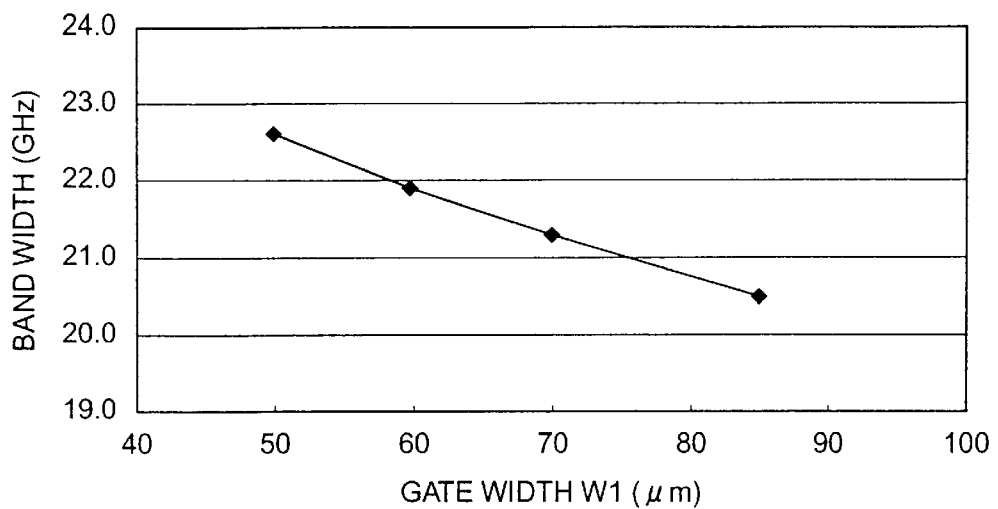
FIG. 12A is a chart showing a bandwidth characteristic of the circuit shown in FIG. 11A.
Figure 12B:
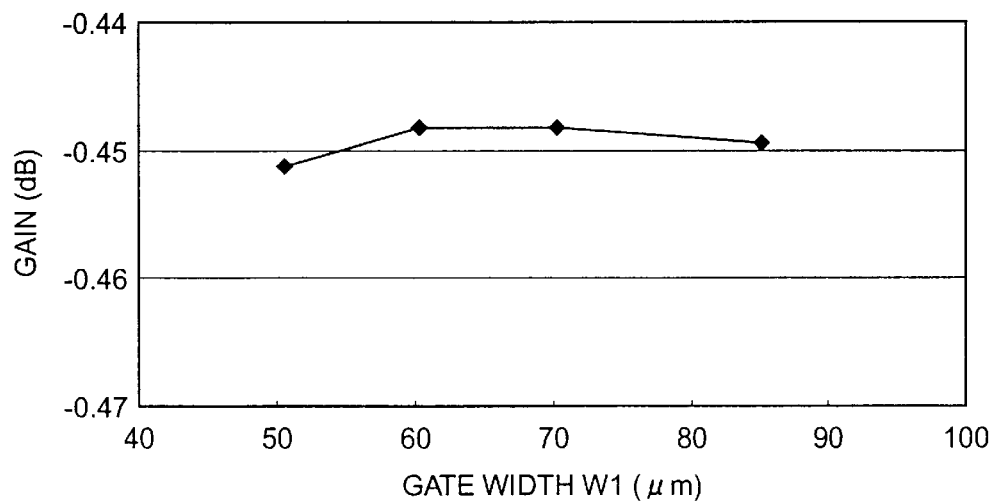
FIG. 12B is a chart showing a gain characteristic of the circuit shown in FIG. 11A.

FIG. 12A shows bandwidth characteristics at the frequency of 200 MHz against several values of the gate width W1, and FIG. 12B shows gain characteristics against several values of the gate width W1. In the characteristics shown in FIGS. 12A and 12B, the gate width W1 is changed in order as W1=85, 70, 60, and 50 μm while maintaining W0=W2= 85 μm in the source follower circuit. This result reveals that the bandwidth of the source follower circuit is improved with decrease in the gate width WI and that the gain is kept almost constant even with decrease in the gate width W1. Therefore, the gain-bandwidth (GB) products in the source follower circuits are enhanced with decrease in the gate width W1.

Figure 11B:
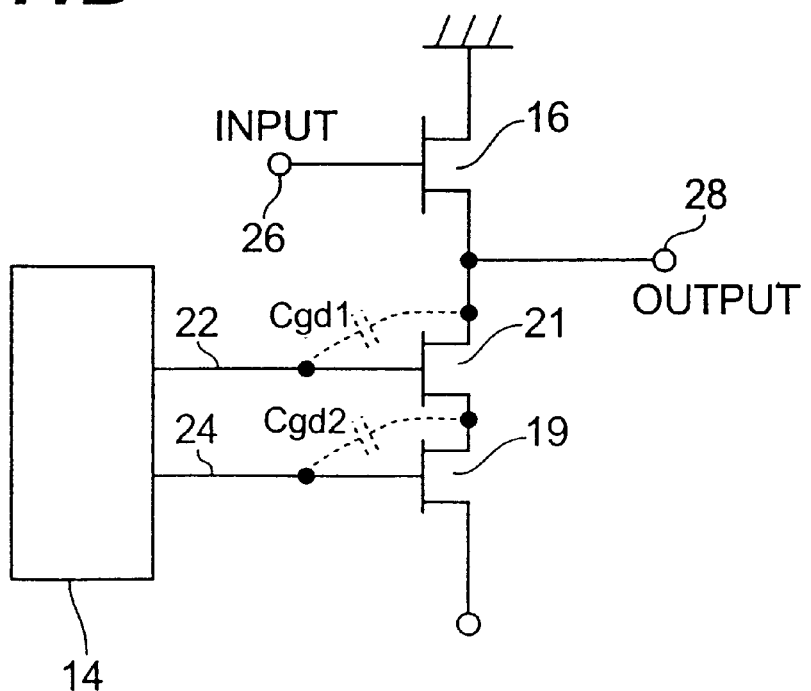
FIG. 11B is an equivalent circuit diagram of the circuit shown in FIG. 11A.

The inventor thinks that the reason for this result can be described as follows. With reference to FIG. 11B, an equivalent circuit diagram of the source follower stage is shown. A capacitance $C_{gs1}$ is provided between the drain and the gate of the transistor 21, and a capacitance $C_{gs2}$ is provided between the drain and the gate of the transistor 19. The transistor width of the transistor 19 is determined so as to obtain a desired constant current characteristic. In this configuration, the capacitance $C_{gs1}$ is smaller than the capacitance $C_{gs2}$. As the gate width W1 of the transistor 21 decreases, the capacitance $C_{gs1}$ decreases. Thus, the capacitance $C_{gs1}$, which is charged or discharged when the output of the source follower circuit is changed, becomes smaller. Therefore, the bandwidth of the source follower circuit is improved with decrease in the value of the gate width W1.

(Sixth Embodiment)

Figure 13:
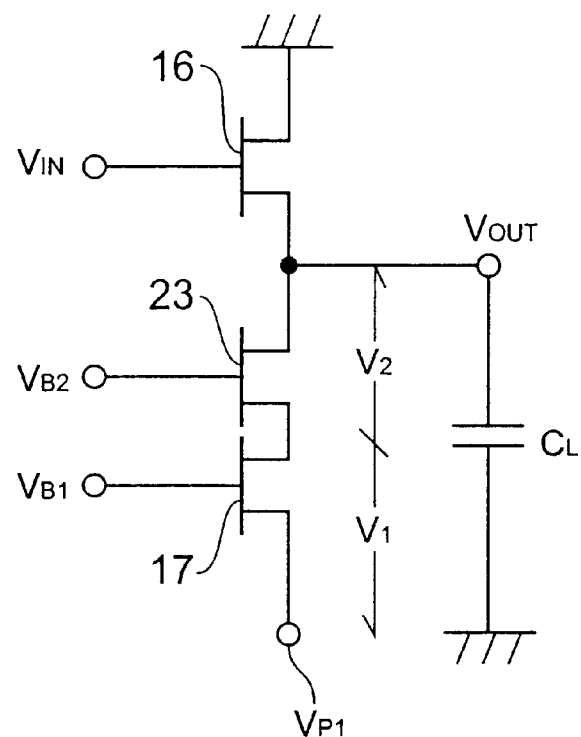
FIG. 13 is a circuit diagram of the source follower stage according to an embodiment of the present invention.

FIG. 13 is a circuit diagram of a source follower stage applicable to the present invention. In this source follower stage, the gate of the transistor 16 is connected to the input $V_{IN}$ and the source thereof is connected to the current source portion and output $V_{OUT}$. The current source portion has transistors 17 and 23 connected in series. The gate of the transistor 17 receives a bias $V_{B1}$ and the gate of the transistor 23 receives a bias $V_{B2}$.

In this source follower stage, the gain and bandwidth thereof were calculated. In both of the characteristics, the voltage applied across the current source portion was 3.3 V. The voltage applied between the source and drain of the transistor 17 is represented by $V_1$ and the voltage applied between the source and drain of the transistor 23 is represented by $V_2$. In order to vary the source-drain voltages $V_1$ and $V_2$ of the transistors 17 and 23, the gate width was varied while keeping the gate lengths of the transistors 17 and 23 constant.

Figure 14A:
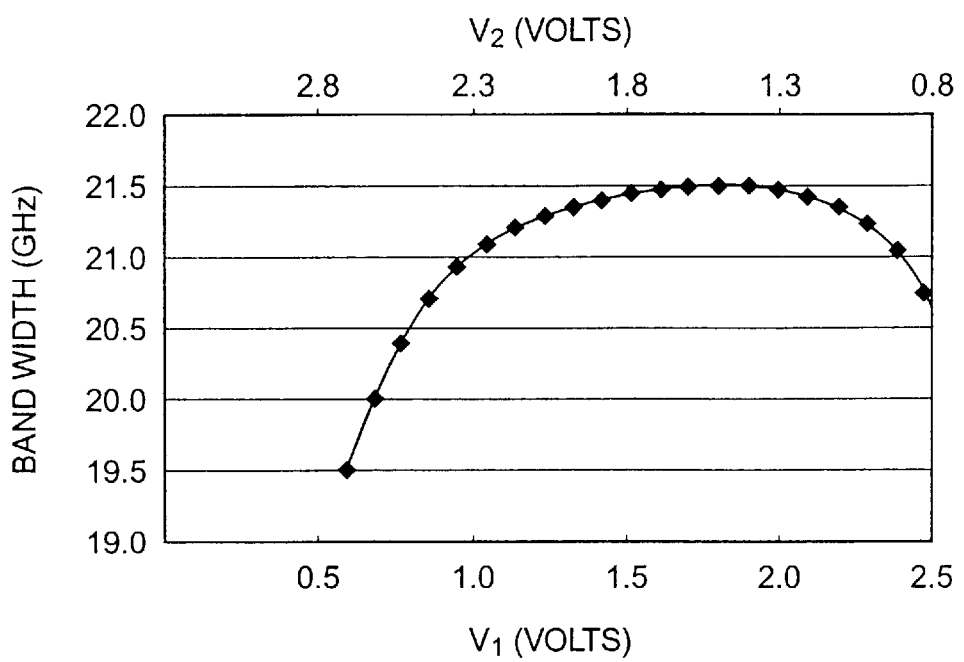
FIG. 14A shows a bandwidth characteristic of the circuit shown in FIG. 13.
Figure 14B:
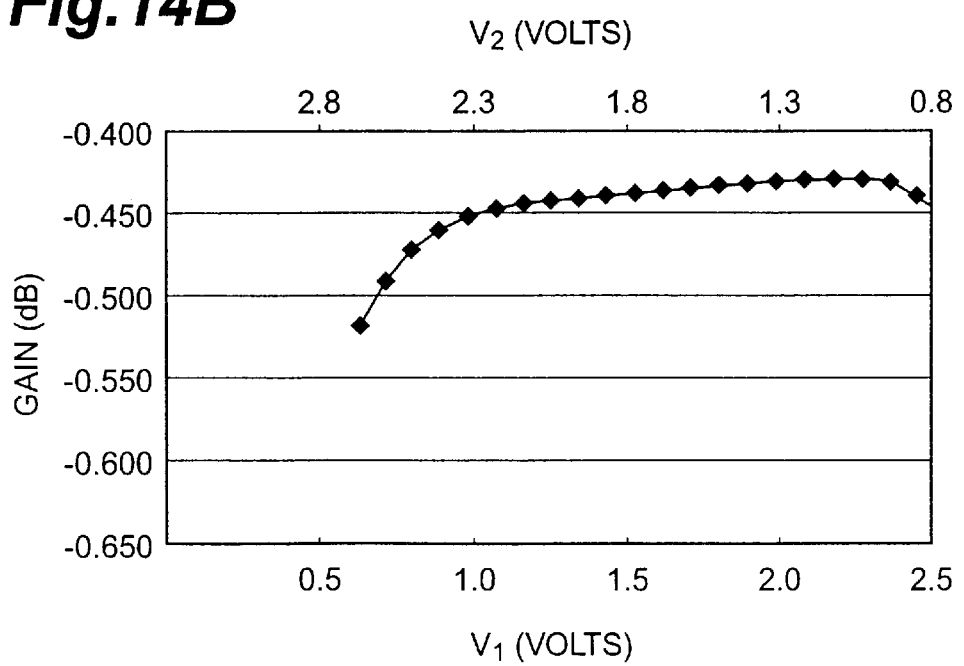
FIG. 14B shows a gain characteristic of the circuit shown in FIG. 13.

FIG. 14A shows the bandwidth characteristic of the circuit shown in FIG. 13A. The bandwidth indicates a gate width obtained at the −3 dB gain and a frequency of 200 MHz. FIG. 14B shows the gain of the circuit shown in FIG. 13A. The gain indicates values at a frequency of 200 MHz. In each of these drawings, the abscissa represents the source-drain voltage of the transistor 17, where $V_1+V_2=3.3$ V and the power-supply voltage $V_{P1}=-4.4$ V. As $V_1$ decreases, the gain and bandwidth increase toward a maximum and thereafter decrease.

The gain of the source follower circuit is approximately constant in the range of potential difference of V1=1 to 2.5 Volts and the bandwidth is kept approximately constant in this region as well. Therefore, the gain-bandwidth (GB) product of the source follower circuit is almost constant in the range of $V_1/(V_1+V_2)$ of not less than 0.3 and not more than 0.75, i.e., $0.75>V_1/(V_1+V_2)>0.3$.

The principle of the present invention has been illustrated and described in the preferred embodiments thereof, and it is apparent to those skilled in the art that the present invention can be modified in arrangement and in detail without departing from the principle described above. For example, in the embodiments, the biasing stage is not limited to the circuits described in the present specification, and may be any circuit that can generate a plurality of different voltages. Accordingly, the inventor claims rights over all modifications and changes falling within the scope of the spirit of the invention and within the scope of the claims which follow.

What is claimed is:

1. A source follower circuit for transmitting a signal received at an input terminal to an output terminal, comprising:

a source follower stage and a bias stage, wherein the source follower stage comprises:

a first III–V compound semiconductor transistor having a source coupled to the output terminal, a drain coupled to a first power line and a gate coupled to the input terminal, a second III–V compound semiconductor transistor having a source coupled to a second power line, a drain and a gate, and a third III–V compound semiconductor transistor having a source coupled to the drain of the second III–V compound semiconductor transistor, a drain coupled to the output terminal, and a gate; and wherein the bias stage has a first node coupled to the gate of the third III–V semiconductor transistor for providing a first bias voltage, a second node coupled to the gate of the second III–V semiconductor transistor for providing a second bias voltage, and a first circuit portion provided to generate the second bias voltage smaller than the first bias voltage.

2. The source follower circuit according to the claim 1, wherein the first circuit portion of the bias stage comprises a first resister provided between the first node and the second node.

3. The source follower circuit according to the claim 2, wherein the bias stage further comprises a fourth III—V compound semiconductor transistor having a source coupled to the second power line, a drain coupled to the second node and a gate coupled to the second node.

4. The source follower circuit according to the claim 2, wherein the bias stage further comprises a fourth III—V compound semiconductor transistor having a source coupled to the first node, a drain coupled to the first power line, and a gate, a fifth III–V compound semiconductor transistor having a source coupled to the second power line, a drain coupled to the gate of the fourth transistor, and a gate coupled to the second node, a second resistor disposed between the first power line and the drain of the fifth transistor, and a third resistor disposed between the second node and the second power line.

5. The source follower circuit according to the claim 1, wherein the first circuit portions of the bias stage comprise a diode disposed between the first node and the second node.

6. The source follower circuit according to the claim 5, wherein the bias stage further comprises a fourth III–V compound semiconductor transistor having a source coupled to the second power line, a drain coupled to the second node and a gate coupled to the second node.

7. The source follower circuit according to the claim 1, wherein the bias stage further comprises a fourth III—V compound semiconductor transistor having a source coupled to the first node, a drain coupled to the first power line, and a gate, a fifth III–V compound semiconductor transistor having a source coupled to the second power line, a drain coupled to the gate of the fourth transistor, and a gate coupled to the second node, a second resistor disposed between the first power line and the drain of the fifth transistor, and a third resistor disposed between the second node and the second power line.

8. The source follower circuit according to the claim 1, wherein a gate width of the third transistor is smaller than a gate width of the second transistor.

9. The source follower circuit according to the claim 8, wherein a gate length of the second transistor is substantially equal to a gate length of third transistor.

10. The source follower circuit according to the claim 1, wherein the second transistor has a coupling capacitance Cgd2 between the gate of the second transistor and the drain of the second transistor, and the third transistor has a coupling capacitance Cgd3 between the gate of the third transistor and the drain of the third transistor, and wherein the coupling capacitance Cgd3 of the third transistor is smaller than the coupling capacitance Cgd2 of the second transistor.

11. The source follower circuit according to the claim 1, further comprising a sixth III–V compound semiconductor transistor between the second transistor and the third transistor, the sixth transistor having a source coupled to the drain of the second transistor, a drain coupled to the source of the third semiconductor, and a gate, the bias stage further comprising a third node coupled to the gate of the sixth transistor for providing a third bias voltage.

12. The source follower circuit according to claim 11, wherein a gate width of the third transistor is smaller than a gate width of the sixth transistor.

13. The source follower circuit according to claim 12, wherein a gate length of the sixth transistor is substantially equal to a gate length of the third transistor.

14. The source follower circuit according to claim 12, wherein the sixth transistor has a coupling capacitance Cgd6 between the gate of the sixth transistor and the drain of the sixth transistor, and the third transistor has a coupling capacitance Cgd3 between the gate of the third transistor and the drain of the third transistor, the coupling capacitance Cgd6 of the third transistor being smaller than the coupling capacitance Cgd6 of the sixth transistor.

15. A differential circuit comprising:
a pair of III–V compound semiconductor transistors each having a source, a drain, and a gate, the pair of transistors being connected so as to form a differential pair;
a first source follower having an input and an output electrically connected to the gate of one transistor of the pair transistors;
a second source follower having an input and an output electrically connected to the gate of the other transistor of the pair transistors; and
a bias stage having a first node for providing a first bias voltage and a second node for providing a second bias voltage smaller than the first bias voltage;
wherein the first source follower and the second source follower each comprise a first III–V compound semiconductor transistor having a source coupled to the output of the respective source follower, a drain coupled to a first power line and a gate coupled to the input of the respective source follower;
a second III–V compound semiconductor transistor having a source coupled to a second power line, a drain coupled to the source of the first transistor and a gate coupled to the second node of the bias stage, and
a third III–V compound semiconductor transistor having a source coupled to the drain of the second transistor, a drain coupled to the output of the respective source follower, and a gate coupled to the first node of the bias stage.

16. The differential circuit according to the claim 15, further comprising a semiconductor laser having a cathode coupled to the drain of one transistor of the differential pair and an anode coupled to a reference potential, the drain of the other transistor of the differential pair being electrically connected to the reference potential,
wherein the semiconductor laser is driven by an electrical signal applied to one input of one of the source followers.

17. A current-voltage conversion circuit comprising:
a preamplifier having an input configured to receive a current signal, an output, an amplification section provided between the input and the output, the amplification section including a source follower and a bias stage having a first node for providing a first bias voltage and a second node for providing a second bias voltage smaller than the first bias voltage; and
a feedback portion connecting the output to the input,
wherein the source follower comprises
an input;
an output,
a first III–V compound semiconductor transistor having a source coupled to the output of the source follower, a drain coupled to a first power line and a gate coupled to the input of the source follower;
a second III–V compound semiconductor transistor having a source coupled to a second power line, a drain coupled to the source of the first transistor and a gate coupled to the second node of the bias stage; and
a third III–V compound semiconductor transistor having a source coupled to the drain of the second transistor, a drain coupled to the output of the source follower, and a gate coupled to the first node of the bias stage.

18. The current-voltage conversion circuit according to the claim 17, further comprising a photodiode having an anode connected to the input of the amplifier and a cathode connected to a reference potential,
wherein a photo current generated in the photodiode is converted to a corresponding voltage signal and output from the output of the amplifier.

* * * * *